(12) United States Patent
Won et al.

(10) Patent No.: US 7,868,421 B2
(45) Date of Patent: Jan. 11, 2011

(54) ANALOG CAPACITOR

(75) Inventors: Seok-Jun Won, Seoul (KR); Yong-Kuk Jeong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 202 days.

(21) Appl. No.: 12/153,306

(22) Filed: May 16, 2008

(65) Prior Publication Data

US 2008/0218936 A1 Sep. 11, 2008

Related U.S. Application Data

(62) Division of application No. 11/052,045, filed on Feb. 8, 2005, now abandoned.

(30) Foreign Application Priority Data

Feb. 9, 2004 (KR) .................. 2004-8495

(51) Int. Cl.
*H01L 29/92* (2006.01)
(52) U.S. Cl. .............. 257/532; 257/E27.048; 257/E29.343
(58) Field of Classification Search .......... 257/352, 257/532, E27.048, E29.343
See application file for complete search history.

(56) References Cited

U.S. PATENT DOCUMENTS

| | | | |
|---|---|---|---|
| 4,384,299 A | 5/1983 | Raffel et al. | |
| 6,341,056 B1 | 1/2002 | Allman et al. | |
| 6,551,896 B2 | 4/2003 | Hosoda et al. | |
| 6,653,155 B2 | 11/2003 | Won et al. | |
| 6,737,694 B2 * | 5/2004 | Kim et al. | 257/296 |
| 6,881,999 B2 | 4/2005 | Lee et al. | |
| 7,192,828 B2 | 3/2007 | Basceri et al. | |
| 2001/0015430 A1 * | 8/2001 | Hartner et al. | 257/1 |

FOREIGN PATENT DOCUMENTS

| | | |
|---|---|---|
| JP | 2001-177057 | 6/2001 |
| KR | 10-1994-0016755 A | 7/1994 |
| KR | 10-2000-0019452 A | 4/2000 |
| KR | 10-0359299 B1 | 10/2002 |
| KR | 10-2003-0076246 A | 9/2003 |

* cited by examiner

*Primary Examiner*—Evan Pert
(74) *Attorney, Agent, or Firm*—Lee & Morse, P.C.

(57) ABSTRACT

Analog capacitors, and methods of fabricating the same, include a lower electrode having a lower conductive layer, a capacitor dielectric layer on the lower conductive layer, and an upper electrode on the capacitor dielectric layer to be opposite to the lower electrode, wherein the upper electrode includes at least an upper conductive layer in contact with the capacitor dielectric layer, wherein the upper conductive layer has a resistivity higher than that of the lower conductive layer.

16 Claims, 6 Drawing Sheets

ANALOG CAPACITOR

CROSS REFERENCE TO RELATED APPLICATION

This is a divisional application based on application Ser. No. 11/052,045, filed Feb. 8, 2005 now abandoned, the entire contents of which is hereby incorporated by reference.

BACKGROUND OF THE INVENTION

1. Field of the Invention

The present invention relates to semiconductor devices and methods of fabricating the same. More particularly, the present invention relates to analog capacitors and methods of fabricating the same.

2. Description of the Related Art

An analog capacitor is one element of a device typically used in an analog-to-digital converter (ADC), a radio frequency (RF) device, a switching capacitor filter, a complementary metal oxide semiconductor (CMOS) image sensor (CIS), etc. An analog capacitor operates based on the fact that the quantity of charge stored in the electrodes on both ends of a dielectric layer varies corresponding to a change of an applied voltage.

When a voltage V is applied to a capacitor, an amount of charge Q stored in the electrodes of both ends of a dielectric layer can be given by Equation (1):

$$Q = C \times V \qquad (1)$$

where C is a capacitance of the capacitor.

If the capacitance C has a constant value, the amount of charge Q is linearly related to the voltage V. The amount of charge stored in the capacitor is constant when the voltage V is fixed. Accordingly, the voltage can be divided into intervals over an operating voltage range of a capacitor, and the amount of charge corresponding to each voltage interval can serve as one bit.

In order to obtain a high number of bits in an analog capacitor, the difference of the amount of charge corresponding to each voltage interval should be large and constant. For this purpose, the dielectric layer used in an analog capacitor needs a low voltage coefficient of capacitance (VCC), i.e., change in capacitance per change in voltage.

The capacitance of the dielectric layer generally depends on the voltage. That is, the capacitance C (V) is a function of an applied voltage V and may be fitted to a quadratic function, which is given by Equation (2):

$$C(V) = C(0) \times (a \times V^2 + b \times V + 1) \qquad (2)$$

where C(0) is a capacitance of a capacitor with no applied voltage, "a" is a quadratic coefficient of VCC, and "b" is a linear coefficient of VCC. Accordingly, in order to have a low VCC, "a" and "b" should be close to zero.

In a conventional capacitor of a polysilicon/insulator/polysilicon (PIP) structure or a metal/insulator/polysilicon (MIP) structure, a depletion layer forms on a polysilicon electrode during operation. This depletion layer substantially increases the thickness of the dielectric layer, which reduces the capacitance of the capacitor and deteriorates the VCC properties. In order to prevent these problems, a metal/insulator/metal (MIM) structure is employed as the analog capacitor.

However, VCC properties of a MIM analog capacitor are deteriorated due to oxidation of an electrode. Several subsequent processes are performed after the lower electrode of the capacitor has been formed during which the surface of the lower electrode of the capacitor may be oxidized. In particular, as oxide series materials with a high dielectric constant replace a silicon nitride layer as the dielectric layer for high integration of the semiconductor device, the surface of the lower electrode may undergo oxidation during the process of forming the dielectric layer on the lower electrode. To prevent this, the surface of the lower electrode is being subjected to rapid thermal nitridation (RTN) or to nitrogen plasma processing. Even using these processes, however, it is difficult to fully prevent the surface of the lower electrode from being oxidized. In particular, suppression of the oxidation of the lower electrode becomes more difficult when a subsequent oxygen curing process is performed to enhance the quality of the capacitor dielectric layer.

When the lower electrode of the analog capacitor is oxidized as described above, the resistance of the oxidized portion increases and the depletion layer may form in the oxidized portion of the lower electrode during operation of the analog capacitor. This depletion layer increases the VCC value, particularly the linear coefficient b of Equation (2). In connection therewith, a capacitor and method of fabricating the same in which a laminated layer of dielectric layers with different electrical properties is used to enhance voltage efficiency properties of the capacitor has been proposed.

SUMMARY OF THE INVENTION

The present invention is therefore directed to analog capacitors and methods of fabricating the same, which substantially overcome one or more of the problems due to the limitations and disadvantages of the related art.

It is a feature of an embodiment of the present invention to provide analog capacitors with enhanced VCC properties.

It is another feature of an embodiment of the present invention to provide analog capacitors with a reduced linear coefficient of VCC.

It is still another feature of an embodiment of the present invention to provide analog capacitors with a reduced quadratic coefficient of VCC.

It is yet another feature of an embodiment of the present invention to provide a capacitor dielectric layer having a positive quadratic coefficient.

It is a further feature of an embodiment of the present invention to provide an upper electrode that has a higher resistance than a lower electrode.

It is yet another feature of an embodiment of the present invention to provide methods of fabricating the analog capacitor.

At least one of the above and other features and advantages of the present invention may be realized by providing a lower electrode including a lower conductive layer, a capacitor dielectric layer on the lower conductive layer; and an upper electrode on the capacitor dielectric layer opposite to the lower electrode, the upper electrode including at least an upper conductive layer in contact with the capacitor dielectric layer, wherein the upper conductive layer has a resistivity higher than that of the lower conductive layer.

An oxygen-doped layer having a resistivity higher than that of the lower conductive layer may be interposed between the lower conductive layer and the capacitor dielectric layer. A lower depletion layer may be formed in the oxygen-doped layer in contact with the capacitor dielectric layer when a voltage is applied between the lower electrode and the upper electrode, and an upper depletion layer may be formed in the upper conductive layer in contact with the capacitor dielectric layer when the voltage is applied between the lower electrode and the upper electrode. The upper depletion layer may have substantially the same capacitance as that of the lower depletion layer.

The lower conductive layer may be a ruthenium (Ru) layer, a platinum (Pt) layer, an iridium (Ir) layer, a titanium nitride (TiN) layer, a tantalum nitride (TaN) layer, a tungsten nitride (WN) layer, a metal nitride layer containing silicon (Si), or a metal nitride layer containing aluminum (Al). The oxygen-doped layer may be a metal layer containing oxygen or a metal nitride layer containing oxygen, the metal layer or the metal nitride layer being the same material as the lower conductive layer. The oxygen-doped layer may be an oxidized upper portion of the lower conductive layer.

The capacitor dielectric layer may be selected from the group consisting of a silicon oxide ($SiO_2$) layer, a silicon nitride ($Si_3N_4$) layer, a metal oxide layer, and a perovskite dielectric layer, and a stacked layer combination thereof. The metal oxide layer may be selected from the group consisting of aluminum oxide ($Al_2O_3$) layer, a hafnium oxide ($HfO_2$) layer, a lanthanum oxide ($La_2O_3$) layer, a zirconium oxide ($ZrO_2$) layer, and a tantalum oxide ($Ta_2O_5$) layer. The perovskite dielectric layer may be selected from the group consisting of a barium strontium titanate (BST) layer, a lead zirconate titanate (PZT) layer, a strontium bismuth tantalite (SBT) layer and a strontium titanate (ST) layer.

The upper conductive layer may be a tungsten (W) layer, a titanium (Ti) layer, a tantalum (Ta) layer, an aluminum (Al) layer, a copper (Cu) layer, a ruthenium (Ru) layer, a platinum (Pt) layer, an iridium (Ir) layer, a titanium nitride (TiN) layer, a tantalum nitride (TaN) layer, a tungsten nitride (WN) layer, a metal nitride layer containing silicon (Si), or a metal nitride layer containing aluminum (Al). The upper conductive layer and the lower conductive layer may be made of a same material, e.g., titanium nitride (TiN). The upper conductive layer may be a metal layer containing oxygen or a metal nitride layer containing oxygen. The metal layer may be a ruthenium (Ru) layer, a platinum (Pt) layer or an iridium (Ir) layer. The metal nitride layer may be a titanium nitride (TiN) layer, a tantalum nitride (TaN) layer, a tungsten nitride (WN) layer, a metal nitride layer containing silicon (Si), or a metal nitride layer containing aluminum (Al). The upper conductive layer may be an oxide layer of titanium nitride (TiON) when the lower conductive layer is a titanium nitride (TiN) layer. The upper conductive layer may be an oxide layer of ruthenium ($RuO_2$) when the lower conductive layer is a ruthenium (Ru) layer.

The upper electrode may further include an additional upper conductive layer disposed on the upper conductive layer, the additional upper conductive layer having a resistivity lower than that of the upper conductive layer.

At least one of the above and other features and advantages of the present invention may be realized by providing a method of fabricating an analog capacitor, including forming a lower insulating layer on a semiconductor substrate, forming a lower electrode having a lower conductive layer on the lower insulating layer, forming a capacitor dielectric layer on the lower conductive layer, and forming an upper electrode on the capacitor dielectric layer including at least an upper conductive layer in contact with the capacitor dielectric layer, wherein the upper conductive layer has a resistivity higher than that of the lower conductive layer.

A surface of the lower conductive layer may be plasma-treated in an atmosphere containing nitrogen before forming the capacitor dielectric layer.

The upper conductive layer may be formed by a deposition method capable of forming a layer having a resistivity higher than that of a layer formed by a deposition method for the lower conductive layer. The upper conductive layer may be formed using one of a chemical vapor deposition (CVD) method, a plasma enhanced chemical vapor deposition (PECVD) method, a physical vapor deposition (PVD) method, a metal organic chemical vapor deposition method, atomic layer deposition (ALD) method, and a plasma enhanced atomic layer deposition (PEALD) method. The upper conductive layer may be formed by the MOCVD method when the lower conductive layer is formed by the PVD method. The upper conductive layer may be a titanium nitride (TiN) layer formed by the MOCVD method when the lower conductive layer is a TiN layer formed by the PVD method.

The upper conductive layer may be a tungsten (W) layer, a titanium (Ti) layer, a tantalum (Ta) layer, an aluminum (Al) layer, a copper (Cu) layer, a ruthenium (Ru) layer, a platinum (Pt) layer, an iridium (Ir) layer, a titanium nitride (TiN) layer, a tantalum nitride (TaN) layer, a tungsten nitride (WN) layer, a metal nitride layer containing silicon (Si), or a metal nitride layer containing aluminum (Al).

The forming the upper conductive layer may include forming an additional conductive layer on the capacitor dielectric layer, and heat-treating the additional conductive layer in a gas atmosphere containing oxygen. The additional conductive layer may be a ruthenium (Ru) layer, a platinum (Pt) layer, an iridium (Ir) layer, a titanium nitride (TiN) layer, a tantalum nitride (TaN) layer, a tungsten nitride (WN) layer, a metal nitride layer containing silicon (Si), or a metal nitride layer containing aluminum (Al). The additional conductive layer may be formed to have a thickness less than about 100 Å. The additional conductive layer may be formed to have a thickness less than about 500 Å when the additional conductive layer is a material layer having good oxygen transmissivity. The additional conductive layer may be a ruthenium (Ru) layer or a platinum (Pt) layer.

Before forming the capacitor dielectric layer, the method may include performing heat-treatment on the lower conductive layer in a gas atmosphere containing oxygen so that a depletion layer is formed on the lower conductive layer adjacent to the capacitor dielectric layer.

The capacitor dielectric layer may have a positive quadratic coefficient of the capacitance-voltage plot. A lower depletion layer and an upper depletion layer adjacent the capacitor dielectric layer may reduce the quadratic coefficient of the capacitance-voltage of the capacitor dielectric layer. The capacitor dielectric layer may be selected from the group consisting of a silicon oxide ($SiO_2$) layer, a silicon nitride ($Si_3N_4$) layer, a metal oxide layer, a perovskite dielectric layer, and a stacked layer combination thereof, the capacitor dielectric layer may include at least one dielectric layer having a positive quadratic coefficient of the capacitance-voltage plot. The at least one dielectric layer may be an aluminum oxide ($Al_2O_3$) layer, the silicon nitride ($Si_3N_4$) layer, or a hafnium oxide ($HfO_2$) layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
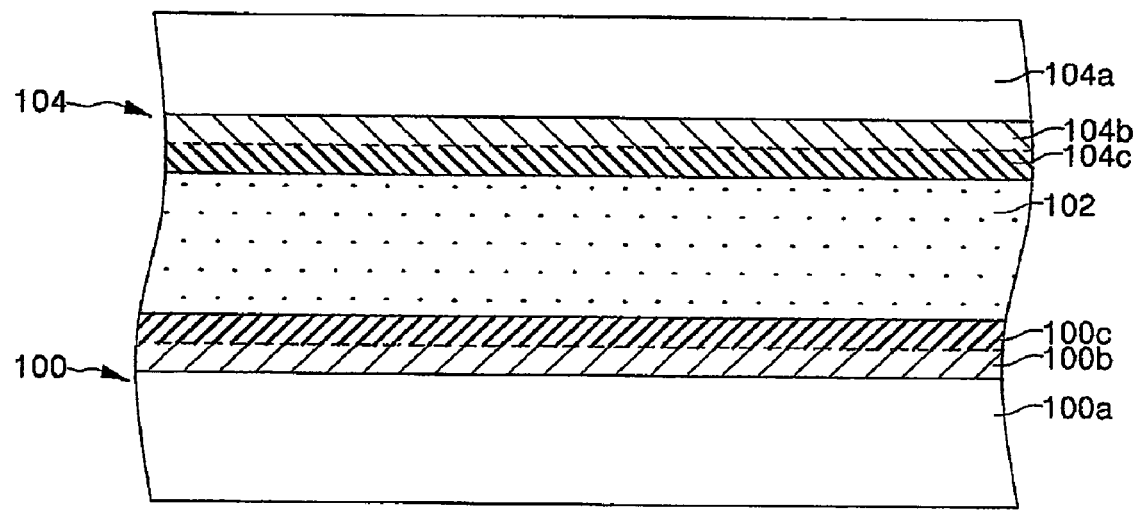
FIG. 1 illustrates a cross-sectional view of an analog capacitor according to an exemplary embodiment of the present invention.

Korean Patent Application No. 2004-8495, filed on Feb. 9, 2004, in the Korean Intellectual Property Office, and entitled: "Analog Capacitor and Method for Fabricating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The principle of the present invention will be first described prior to discussing an analog capacitor according to exemplary embodiments of the present invention.

In a conventional analog capacitor, a VCC value, particularly, a linear coefficient of the VCC, increases because, during the process of forming the analog capacitor, a lower electrode is oxidized at a portion adjacent to a capacitor dielectric layer, and a depletion layer is formed in the oxidized portion. The increase of the linear coefficient of the VCC means that the symmetry of a capacitance-voltage plot of the analog capacitor with respect to a capacitance axis is degraded. Accordingly, an embodiment of the present invention is directed to reducing the VCC value, particularly the linear coefficient of the VCC value, by producing the depletion layer at an interface between the capacitor dielectric layer and the upper electrode. Forming respective depletion layers at respective interfaces of the lower and upper electrodes adjacent to the capacitor dielectric layer results in an improved VCC value, especially when the respective depletion layers have substantially the same capacitance.

Hereinafter, an analog capacitor according to an exemplary embodiment of the present invention will be described with reference to FIG. 1. Referring to FIG. 1, a capacitor dielectric layer 102 is interposed between a lower electrode 100 and an upper electrode 104. Each of the lower electrode 100 and upper electrode 104 is connected with interconnection lines to apply a voltage to the capacitor or to allow charges to move. The lower electrode 100 may be a single layer composed of a lower conductive layer 100a, or may be a stacked layer of at least two metal compound layers including the lower conductive layer 100a. The lower conductive layer 100a may be a metal layer or a metal nitride layer. The metal layer may be a ruthenium (Ru) layer, a platinum (Pt) layer or an iridium (Ir) layer. The metal nitride layer may be a titanium nitride (TiN) layer, a tantalum nitride (TaN) layer, a tungsten nitride (WN) layer, a metal nitride layer containing silicon (Si), or a metal nitride layer containing aluminum (Al).

The capacitor dielectric layer 102 may be a dielectric layer selected from the group consisting of a silicon oxide ($SiO_2$) layer, a silicon nitride ($Si_3N_4$) layer, a metal oxide layer, and a perovskite dielectric layer, or a stacked layer of a combination thereof. The metal oxide layer may be an aluminum oxide ($Al_2O_3$) layer, a hafnium oxide ($HfO_2$) layer, a lanthanum oxide ($La_2O_3$) layer, a zirconium oxide ($ZrO_2$) layer, or a tantalum oxide ($Ta_2O_5$) layer. Further, the perovskite dielectric layer may be a barium strontium titanate (BST) layer, a lead zirconate titanate (PZT) layer, a strontium bismuth tantalite (SBT) layer or a strontium titanate (ST) layer.

An oxygen-doped layer 100b may be further interposed between the lower conductive layer 100a and the capacitor dielectric layer 102. The oxygen-doped layer 100b may be a metal layer containing oxygen or a metal nitride layer containing oxygen. The metal layer or metal nitride layer serving as the oxygen-doped layer 100b may be the same material as that of the lower conductive layer 100a. In actuality, the oxygen-doped layer 100b is formed due to oxidization of an upper portion of the lower conductive layer 100a, and may be a portion of the lower conductive layer 100a. For the sake of convenience of explanation, however, the lower conductive layer 100a and the oxygen-doped layer 100b will be described as being separate layers. The terms "oxidization" and "oxide layer" used in reference to the conductive layer, or any layer other than the capacitor dielectric layer, is not to mean that the layer is completely oxidized so as to have insulating properties, but rather is used herein to mean that the layer remains conductive, but has an increased resistivity due to the oxygen. Accordingly, the oxygen-doped layer 100b is a layer formed by oxidation of an upper portion of the lower conductive layer 100a, and is a conductive layer with a resistivity higher than that of the lower conductive layer 100a which has not been oxidized.

The upper electrode 104 is disposed on the capacitor dielectric layer 102 opposite to the lower electrode 100. The upper electrode 104 includes at least an upper conductive layer 104b adjacent to the capacitor dielectric layer 102. Moreover, the upper electrode 104 may be a stacked layer of at least two metal compound layers including the upper conductive layer 104b and the additional upper conductive layer 104a, both of which are sequentially stacked on the capacitor dielectric layer 102. When the upper electrode 104 is a stacked layer of the upper conductive layer 104b and the additional upper conductive layer 104a, the additional upper conductive layer 104a may be a metal compound layer with a lower resistivity than that of the upper conductive layer 104b. The upper conductive layer 104b may be a metal compound layer with a high resistance so that a depletion layer is formed adjacent to the capacitor dielectric layer 102.

As described above, the analog capacitor according to the exemplary embodiment of the present invention includes the oxygen-doped layer 100b and the upper conductive layer 104b adjacent to the capacitor dielectric layer 102 in the lower electrode 100 and the upper electrode 104. As a result, when a voltage is applied between the lower electrode and the upper electrode during operation of the analog capacitor, a lower depletion layer 100c is formed on the oxygen-doped layer 100b adjacent to the capacitor dielectric layer 102. Further, an upper depletion layer 104c is formed on the upper conductive layer 104b adjacent to the capacitor dielectric layer 102.

In an exemplary embodiment of the present invention, the upper depletion layer 104c formed in the upper conductive layer 104b may have a capacitance close to or identical to the capacitance of the lower depletion layer 100c. The upper depletion layer 104c may be made to have the same capacitance as that of the lower depletion layer 100c by adjusting the resistivity of the upper conductive layer 104b in which the upper depletion layer 104c is formed.

For example, the upper conductive layer 104b may be a conductive layer with a resistivity higher than that of the lower conductive layer 100a. The upper conductive layer 104b may be a metal layer, e.g., a tungsten (W) layer, a titanium (Ti) layer, a tantalum (Ta) layer, an aluminum (Al) layer, a copper (Cu) layer, a Ru layer, a Pt layer, or an Ir layer, or a metal nitride layer, e.g., a TiN layer, a TaN layer, a WN layer, a metal nitride layer containing Si, or a metal nitride layer containing aluminum Al.

The case, the upper conductive layer 104b may be a metal compound layer formed by a different deposition that used to form the lower conductive layer 100a. Methods for depositing a metal compound layer include a physical vapor deposition (PVD) method, a chemical vapor deposition (CVD) method, a plasma enhanced chemical vapor deposition (PECVD) method, a metal organic chemical vapor deposition (MOCVD) method, an atomic layer deposition (ALD) method, or a plasma enhanced atomic layer deposition (PEALD) method. Even when depositing a same metal compound, resistivity of the deposited metal compound will vary depending on how the deposition is performed. For example, the resistivity of a deposited TiN layer can have a value between about 500 $\mu\Omega$·cm to about 50,000 $\mu\Omega$·cm depending on a deposition method used. In an exemplary embodiment of the present invention, when the lower conductive layer 100a is a TiN layer formed by the PVD method, the upper conductive layer 104b may be a TiN layer formed by the MOCVD method.

Further, the upper conductive layer 104b may be a different material layer with a resistivity higher than that of the lower conductive layer 100a, and may be a metal compound layer. For example, when the lower conductive layer 100a is a Ru layer with resistivity of about 20 $\mu\Omega$·cm, the upper conductive layer 104b may be a TiN layer with resistivity of about 500 $\mu\Omega$·cm. When the lower conductive layer 100a is a Ru layer and the upper conductive layer 104b is the TiN layer, the capacitor dielectric layer 102 may be a stacked layer of a $Ta_2O_5$ layer and an $HfO_2$ layer, a stacked layer of a $Ta_2O_5$ layer and a $La_2O_3$ layer, or a stacked layer of a $Ta_2O_5$ layer and a $ZrO_2$ layer.

Further, in an exemplary embodiment of the present invention, the upper conductive layer 104b may be a metal layer containing oxygen or a metal nitride layer containing oxygen. For example, the upper conductive layer 104b may be an oxide layer of selected from the group consisting of a Ru layer, a Pt layer, a Ir layer, a TiN layer, a TaN layer, a WN layer, a metal nitride layer containing Si, and a metal nitride layer containing Al. For example, when the lower conductive layer 100a is a TiN layer, the upper conductive layer 104b may be a TiON layer. Further, when the lower conductive layer 100a is a Ru layer, the upper conductive layer 104b may be a $RuO_2$ layer.

As described above, according to an exemplary embodiment of the present invention, the lower depletion layer 100c and the upper depletion layer 104c, which may have the same capacitance, are formed on both sides of the capacitor dielectric layer 102, thereby enhancing the VCC properties and, in particular, reducing the linear coefficient. Whether the lower depletion layer 100c and the upper depletion layer 104c each formed in the interfaces of the capacitor dielectric layer 102 and the lower and upper electrodes 100, 104 have substantially the same capacitance, thereby enhancing VCC properties, particularly reducing the linear coefficient, may be confirmed based on the symmetry of the capacitance-voltage plot of the analog capacitor with respect to a capacitance axis.

Furthermore, according to an exemplary embodiment of the present invention, the capacitor dielectric layer 102 may be a dielectric layer having a positive quadratic coefficient of the capacitance-voltage plot. Generally, when the capacitor dielectric layer is a dielectric layer with a negative charge trap, e.g., an $Al_2O_3$ layer, an $HfO_2$ layer, or a $Si_3N_4$ layer, the quadratic coefficient of the capacitance-voltage plot is positive, due to a decrease in an electrical equivalent thickness of the dielectric layer as the voltage increases. Further, when the capacitor dielectric layer is a dielectric layer with a positive charge trap, e.g., $Ta_2O_5$ or $SiO_2$, the quadratic coefficient of the capacitance-voltage plot is negative. Accordingly, in an exemplary embodiment of the present invention, the capacitor dielectric layer 102 is selected from the group consisting of a $SiO_2$ layer, a $Si_3N_4$ layer, a metal oxide layer, a perovskite dielectric layer, and a stacked layer of a combination thereof, wherein the dielectric layer 102 may include at least one dielectric layer of which a positive quadratic coefficient of the capacitance-voltage plot. The at least one dielectric layer having a positive quadratic coefficient of the capacitance-voltage plot may be an $Al_2O_3$ layer, a $Si_3N_4$ layer, or an $HfO_2$ layer.

On the other hand, when there is no effect by charges in the capacitor dielectric layer, but only an effect by depletions created in the electrodes, the quadratic coefficient of the capacitance-voltage plot will be negative, due to an increase of the electrical equivalent thickness of the capacitor dielectric layer. Accordingly, when the capacitance-voltage plot of the capacitor dielectric layer 102 has a positive quadratic coefficient, the VCC properties may be enhanced by producing the upper depletion layer 104c and the lower depletion layer 100c having preferably the same capacitance at both sides of the capacitor dielectric layer 102, respectively. That is, the linear coefficient in the quadratic function of the capacitance represented as a function of a voltage may be reduced by the upper depletion layer 104c and the lower depletion layer 100c formed in balance on both sides of the capacitor dielectric layer 102, as described above. Further, the quadratic coefficient, which indicates a degree of curvature in the quadratic function, may also be reduced by combining the effect by electrode depletion and curve properties by the negative charge trap of the capacitor dielectric layer 102.

FIGS. 2 through 5 illustrate cross-sectional views of stages in a method of fabricating an analog capacitor according to a first embodiment of the present invention.

Figure 2:
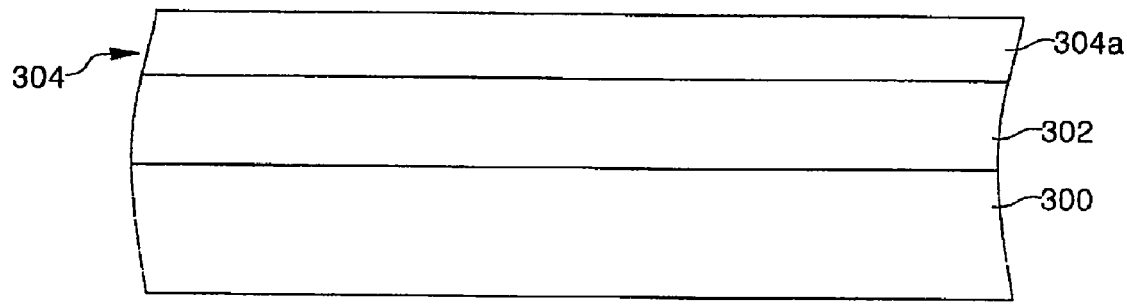
FIGS. 2 through 5 illustrate cross-sectional views of stages in a method of fabricating an analog capacitor according to a first embodiment of the present invention.

Referring to FIG. 2, a lower insulating layer 302 is formed on a semiconductor substrate 300. Interconnection lines (not shown) may have already been formed on the semiconductor substrate 300. The lower insulating layer 302 may be a low-k dielectric layer, e.g., a silicon oxide layer. A lower electrode structure 304 is formed on the semiconductor substrate with the lower insulating layer 302 formed thereon. The lower electrode structure 304 includes at least a lower conductive layer 304a. That is, the lower electrode structure 304 may be formed of only the lower conductive layer 304a, or may be a stacked layer of metal compound layers including the lower conductive layer 304a. The lower conductive layer 304a may be a metal layer, e.g., a Ru layer, a Pt layer or an Ir layer, or a metal nitride layer, e.g., a TiN layer, a TaN layer, a WN layer, a metal nitride layer containing Si, or a metal nitride layer containing Al. After the lower electrode structure 304 has been formed, a portion of the lower electrode structure 304, i.e., the surface of the lower conductive layer 304a, may be plasma treated at an atmosphere containing nitrogen, e.g., $NH_3$ or $N_2$.

Figure 3:
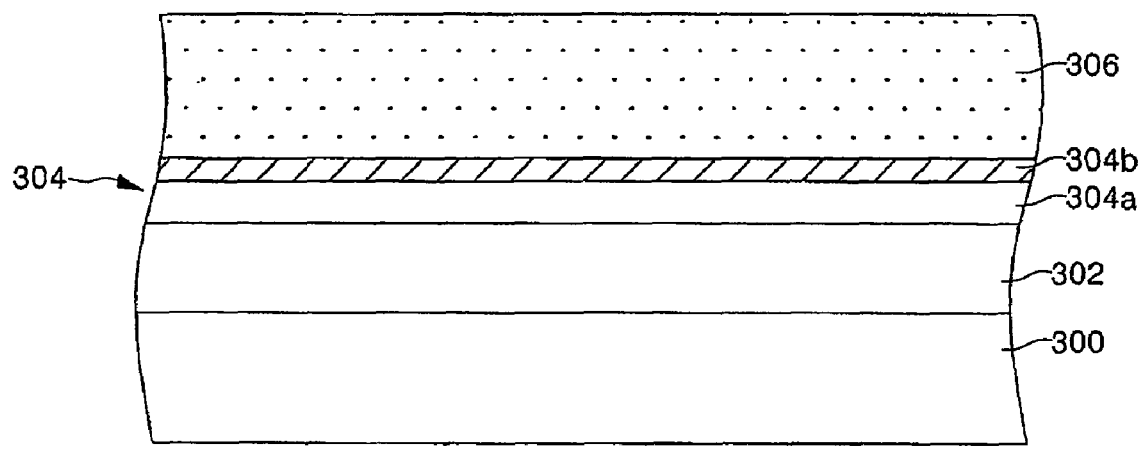

Referring to FIG. 3, a capacitor dielectric layer 306 is formed on the lower electrode structure 304. The capacitor dielectric layer 306 may be a dielectric layer selected from the group consisting of a silicon oxide layer ($SiO_2$), a silicon nitride layer ($Si_3N_4$), a metal oxide layer, and a perovskite dielectric layer, and a stacked layer combination thereof. Then, in order to enhance layer quality of the capacitor dielectric layer 306, heat-treatment may be performed on the capacitor dielectric layer 306 in a gas atmosphere containing oxygen, e.g., $O_2$ or $O_3$. Meanwhile, an upper portion of the lower conductive layer 304a may undergo oxidation during the process of forming the capacitor dielectric layer 306 or the heat-treating process. Consequently, an oxygen-doped layer 304b may be formed on the lower conductive layer 304a adjacent to the capacitor dielectric layer 306.

Figure 4:
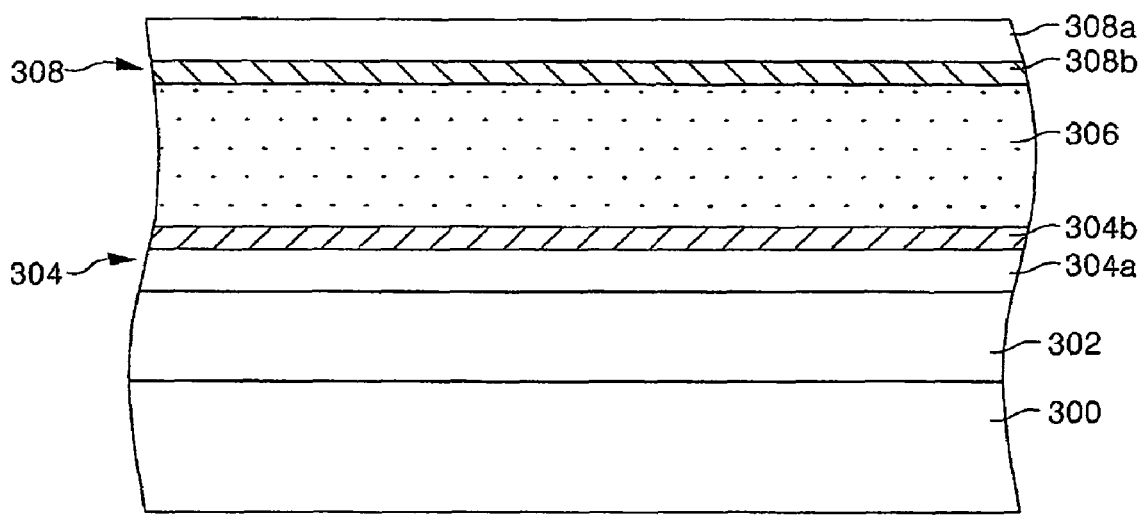

Referring to FIG. 4, an upper electrode structure 308 is formed on the capacitor dielectric layer 306. The upper electrode structure 308 includes at least an upper conductive layer 308b in contact with the capacitor dielectric layer 306. Moreover, the upper electrode structure 308 may include the upper conductive layer 308b and an additional upper conductive layer 308a, stacked on the capacitor dielectric layer 306 in sequence. When the upper electrode structure 308 is a stacked layer of the upper conductive layer 308b and the additional upper conductive layer 308a, the additional upper conductive layer 308a preferably is a metal compound layer with a resistivity lower than that of the upper conductive layer 308b. In a first embodiment of the present invention, the upper conductive layer 308b is preferably formed of a high-resistive film to produce a depletion layer adjacent to the capacitor dielectric layer 306.

In the first embodiment of the present invention, the upper conductive layer 308b is preferably formed to have a resistivity higher than that of the lower conductive layer 304a. In this case, the upper conductive layer 308b may have a resistivity higher than that of the lower conductive layer 304a by using a deposition method different from that of the lower conductive layer 304a. As noted above, when different deposition methods are applied to the same metal compounds, the resistivity of the deposited metal compound layers will have a different value. The method of depositing the upper conductive layer 308b may be selected from deposition methods such as a PVD method, a CVD method, a PECVD method, a MOCVD method, an ALD method, and a PEALD method. For example, in the case where the lower conductive layer 304a is a TiN layer formed by the PVD method, the upper conductive layer 308b may be formed of a TiN layer by the MOCVD method.

Further, in an exemplary embodiment of the present invention, the upper conductive layer 308b may be formed of material layer with a resistivity higher than that of the lower conductive layer 304a, and preferably may be formed of a metal compound layer. The upper conductive layer 308b may be selected from the group consisting of a metal layer, e.g., W, Ti, Ta, Al, Cu, Ru, Pt, or Ir, a metal nitride layer such as TiN, TaN or WN, a metal nitride layer containing Si, and a metal nitride layer containing Al, and preferably has a resistivity higher than that of the lower conductive layer 304a. For example, when the lower conductive layer 304a is a Ru layer, the upper conductive layer 308b may be a TiN layer, and the capacitor dielectric layer 306 may be a stacked layer of a $Ta_2O_5$ layer and an $HfO_2$ layer.

According to the first embodiment of the present invention, the upper conductive layer 308b is formed corresponding to the oxygen-doped layer 304b as described above. As a result, since lower and upper depletion layers are formed on the oxygen-doped layer 304b and the upper conductive layer 308b, respectively during operation of the analog capacitor, it is possible to prevent the VCC properties of the analog capacitor from deteriorating due to a depletion layer asymmetrically formed on only one side of the capacitor dielectric layer 306. The lower depletion layer and the upper depletion layer, being formed on the oxygen-doped layer 304b and the upper conductive layer 308b, respectively, may have the same capacitance, which may be varied by adjusting the resistivity of the upper conductive layer 308b.

Figure 5:
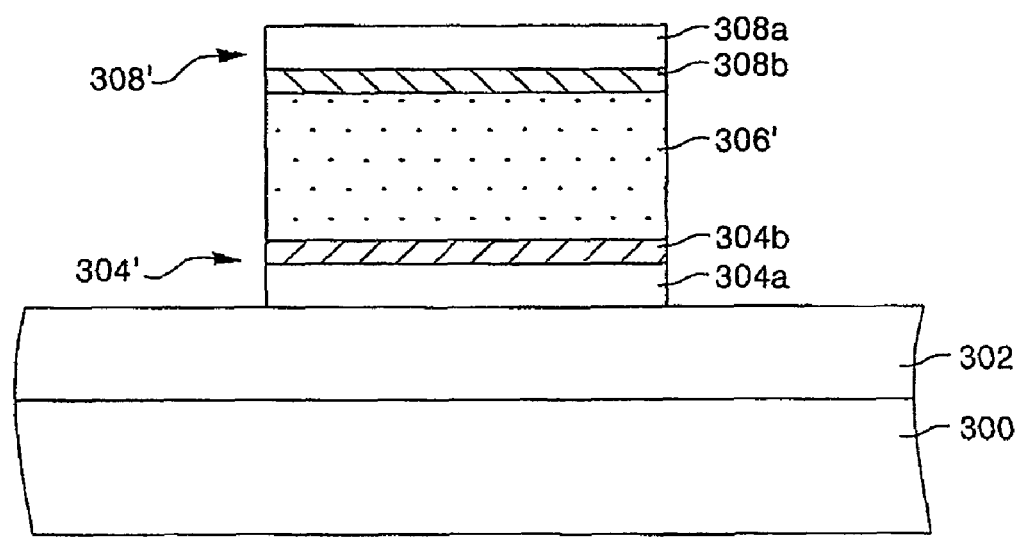

Referring to FIG. 5, the upper electrode structure 308, the capacitor dielectric layer 306 and the lower electrode structure 304 are sequentially patterned, e.g., using a photolithography process. As a result, an analog capacitor composed of a lower electrode 304', a capacitor dielectric layer pattern 306' and an upper electrode 308' is fabricated on the lower insulating layer 302. Then, an inter-layer insulating layer covering the entire surface of the analog capacitor and interconnection lines for electrically connecting the upper electrode 308' through the inter-layer insulating layer may be provided.

Figure 6:
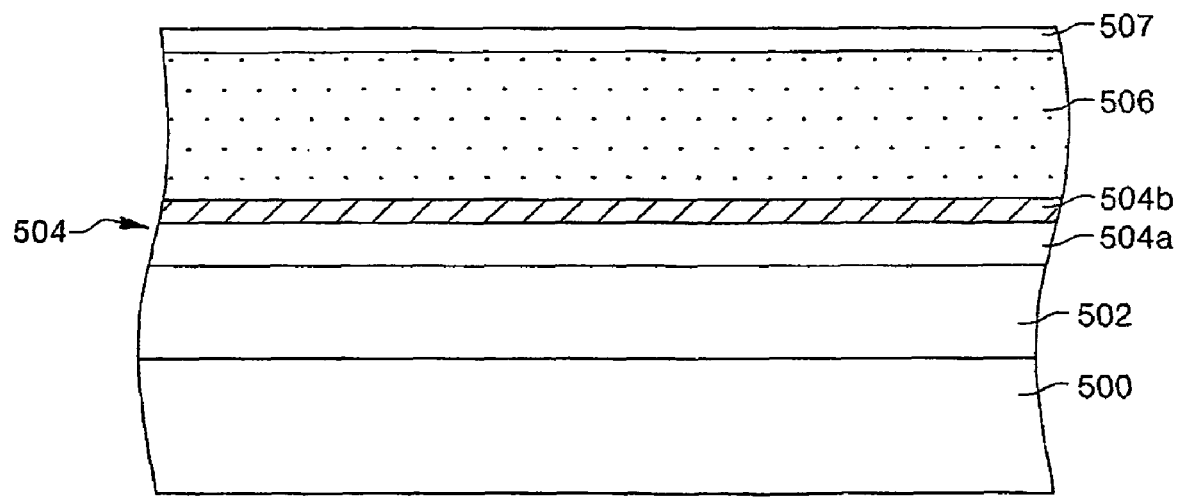
FIGS. 6 and 7 illustrate cross-sectional views of stages in a method of fabricating an analog capacitor according to a second embodiment of the present invention.
Figure 7:
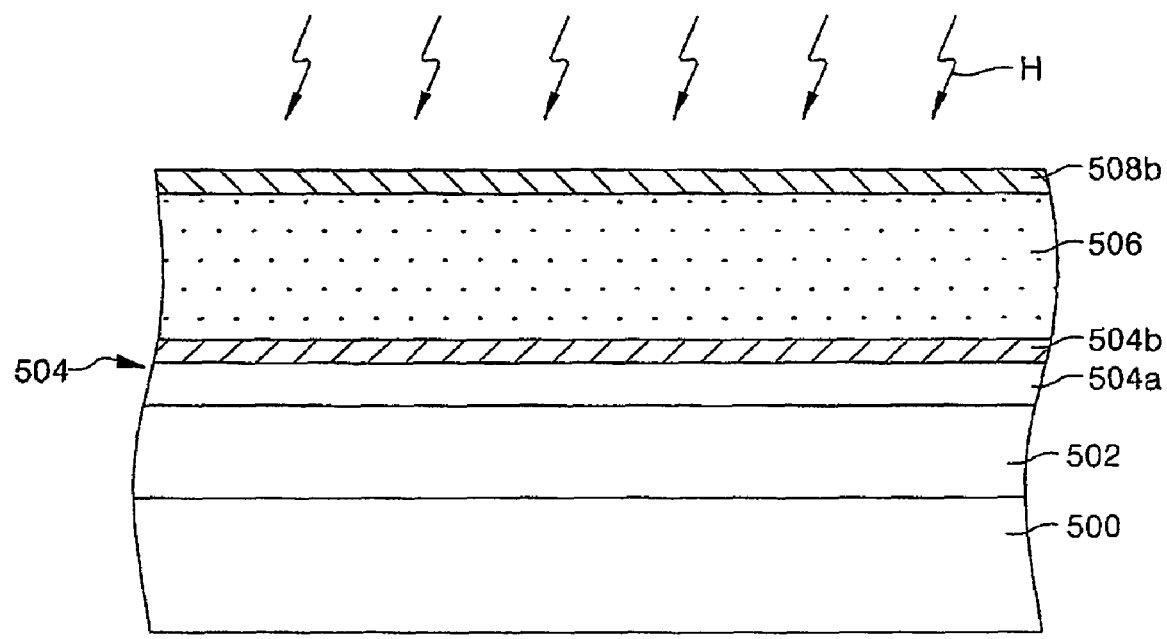

FIGS. 6 and 7 illustrate cross-sectional views of stages in a method of fabricating an analog capacitor according to a second embodiment of the present invention.

Referring to FIG. 6, a lower insulating layer 502 is formed on a semiconductor substrate 500. A lower electrode structure 504 including a lower conductive layer 504a and a capacitor dielectric layer 506 are sequentially formed on the lower insulating layer 502 by the same method as in the first embodiment of the present invention. Further, an oxygen-doped layer 504b may be formed on the lower conductive layer 504a at a portion adjacent to the capacitor dielectric layer 506. An additional conductive layer 507 is formed on the capacitor dielectric layer 506. The additional conductive layer 507 may be formed of a metal layer, e.g., Ru layer, a Pt layer or a Ir layer, or a metal nitride layer, e.g., a metal nitride layer containing Si or Al.

Referring to FIG. 7, an upper conductive layer 508b composed of an oxide layer of the additional conductive layer 507 is formed on the capacitor dielectric layer 506 by heat-treating (H) the additional conductive layer 507 in an oxygen atmosphere, e.g., $O_2$ or $O_3$. In the second embodiment of the present invention, the additional conductive layer 507 is formed in order to form the upper conductive layer 508b capable of producing a depletion layer adjacent to the capacitor dielectric layer 306. If the additional conductive layer 507 is too thick, oxidation of the additional conductive layer 507 may cause power loss or degradation of RF properties. Accordingly, the additional conductive layer 507 is preferably formed to have a minimal thickness in consideration of the thickness of a depletion layer subsequently formed in the upper conductive layer 508b, and is preferably formed to have a thickness less than about 100 Å. A material layer with excellent oxygen transmissivity, such as a Ru layer or a Pt layer, may be formed to have a thickness less than about 500 Å. After the upper conductive layer 508b has been formed, an additional upper conductive layer may be further formed on the upper conductive layer 508b. In this case, the additional upper conductive layer preferably has a resistivity lower than that of the upper conductive layer 508b. Thereafter, formation of the analog capacitor is completed using the same processes as those in the first embodiment of the present invention.

According to yet another embodiment of the present invention, the capacitor dielectric layer may be a dielectric layer having a positive quadratic coefficient of the capacitance-voltage plot in either the first or second embodiments of the present invention. In this case, the capacitor dielectric layer may be selected from the group consisting of a $SiO_2$ layer, a $Si_3N_4$ layer, a metal oxide layer, a perovskite dielectric layer, and a stacked layer combination thereof, wherein the capacitor dielectric layer may include at least one dielectric layer having a positive quadratic coefficient of the capacitance-voltage plot, e.g., an $Al_2O_3$ layer, a $Si_3N_4$ layer, or an $HfO_2$ layer.

According to yet another embodiment of the present invention, a process of performing heat-treatment in a gas atmosphere containing oxygen, e.g., $O_2$ or $O_3$, may be further performed on the lower conductive layer prior to forming the capacitor dielectric layer having the positive quadratic coefficient of the capacitance-voltage plot. In this case, it is preferable that nitrogen plasma treatment is not performed on the surface of the lower conductive layer. As a result of heat-treating the lower conductive layer in the oxygen atmosphere, the oxygen-doped layer formed on the lower conductive layer may have an increased resistivity. As the resistivity of the oxygen-doped layer increases, the lower depletion layer then formed on the oxygen-doped layer during operation of the capacitor will have an increased thickness with respect to the same voltage. Thereafter, the capacitor dielectric layer is formed on the oxygen-doped layer, and then an upper conductive layer is formed on the capacitor dielectric layer so that the upper depletion layer having preferably the same capacitance as that of the lower depletion layer is formed. As a result, the upper depletion layer and the lower depletion layer, each being formed at an interface of the capacitance dielectric layer and the upper conductive layer and the oxygen-doped layer, will have a larger thickness, so that the quadratic coefficient of the capacitance-voltage plot of the capacitance dielectric layer may be further reduced.

EXAMPLES

Figure 8:
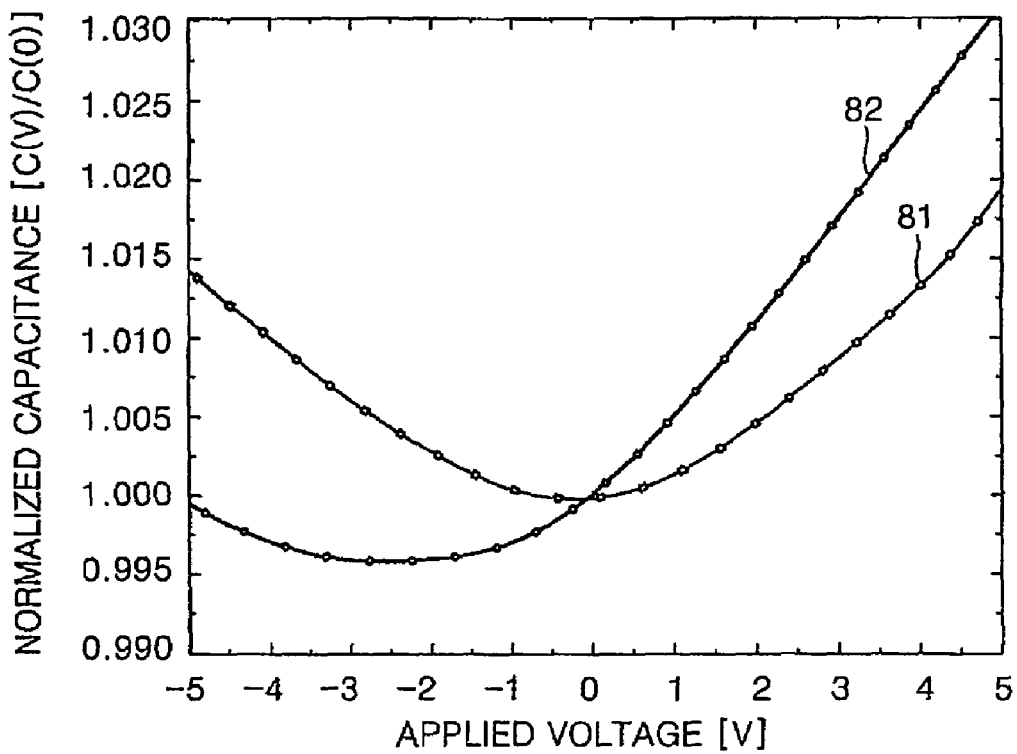
FIG. 8 is a normalized capacitance-voltage plot of a conventional analog capacitor.
Figure 9:
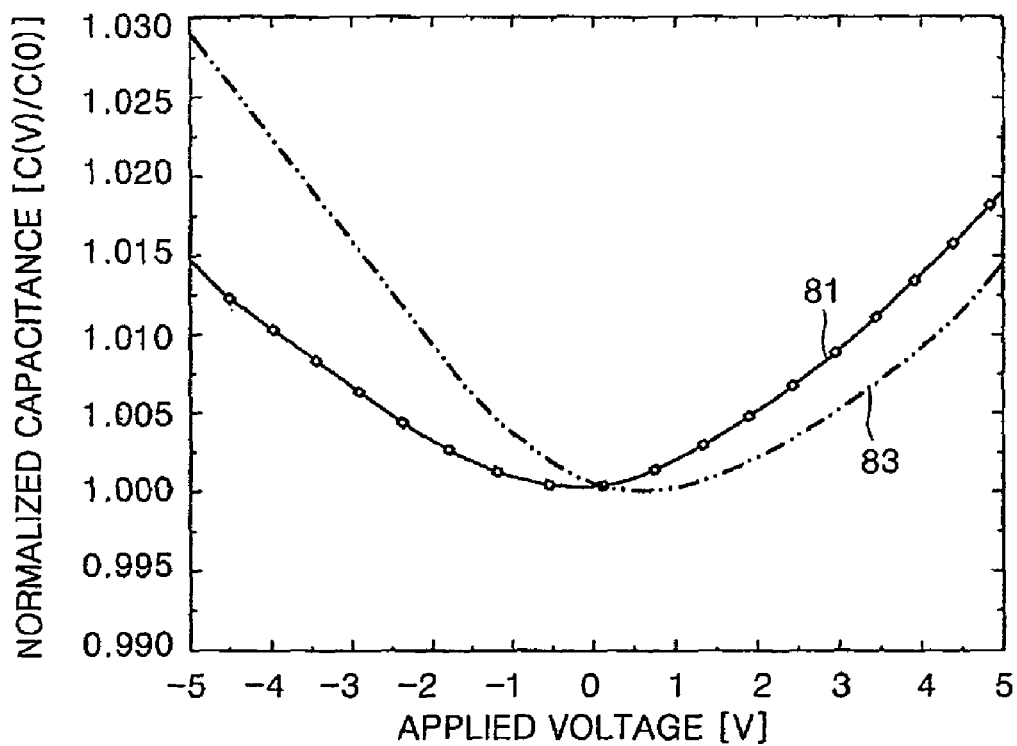
FIG. 9 is a normalized capacitance-voltage plot of an analog capacitor according to an embodiment of the present invention.

FIG. 8 is a normalized capacitance-voltage plot of a conventional analog capacitor, and FIG. 9 is a normalized capacitance-voltage plot of an analog capacitor according to an embodiment of the present invention. The capacitance-voltage plots of FIGS. 8 and 9 are capacitance-voltage plots of analog capacitors fabricated according to Table 1 below, respectively.

TABLE 1

| Sample | Lower electrode | Surface treatment of lower electrode | Capacitor dielectric layer | Post-treatment of dielectric layer | Upper electrode |
|---|---|---|---|---|---|
| First sample 81 | PVD-TiN | $NH_3$ plasma | $Ta_2O_5/HfO_2/Ta_2O_5$ | x | PVD-TiN |
| Second sample 82 | PVD-TiN | $NH_3$ plasma | $Ta_2O_5/HfO_2/Ta_2O_5$ | $O_3$ processing | PVD-TiN |
| Third sample 83 | PVD-TiN | $NH_3$ plasma | $Ta_2O_5/HfO_2/Ta_2O_5$ | $O_3$ processing | MOCVD-TiN |

Referring to FIGS. 8 and 9, by comparing the capacitance-voltage plots of the first sample 81 and the second sample 82 when the capacitor dielectric layer was formed and subjected to $O_3$ treatment, the capacitance-voltage plot in the second sample 82 is asymmetric with respect to the capacitance axis even though $NH_3$ plasma processing has been performed on the lower electrode. In particular, the linear coefficient of the second sample 82 is about $0.33 \times 10^{-2}$, which is much greater than the $0.41 \times 10^{-3}$ of the first sample 81. It is assumed that this result was due to the surface of the lower electrode being oxidized while performing the $O_3$ treatment on the capacitor dielectric layer such that a depletion layer was formed in the oxidized portion.

In contrast, in the case of the third sample 83 in accordance with an embodiment of the present invention, the upper electrode was formed of a TiN layer by the MOCVD method, unlike the second sample 82, in which the upper electrode was formed in the same manner as the lower electrode. Thus, the upper electrode of the third sample 83 has a resistivity higher than that of the lower electrode. As a result, the linear coefficient of the third sample 83 is greatly reduced to $-0.17 \times 10^{-2}$. This result shows that the linear coefficient of the capacitance-voltage plot may be reduced when the depletion layers are formed in balance on upper/lower interfaces of the capacitor dielectric layer by forming the upper electrode having a resistivity higher than that of the lower electrode. Further, the result of the third sample 83 shows that the linear coefficient may be made to be close to zero by adjusting the resistivity of the upper electrode.

Figure 10:
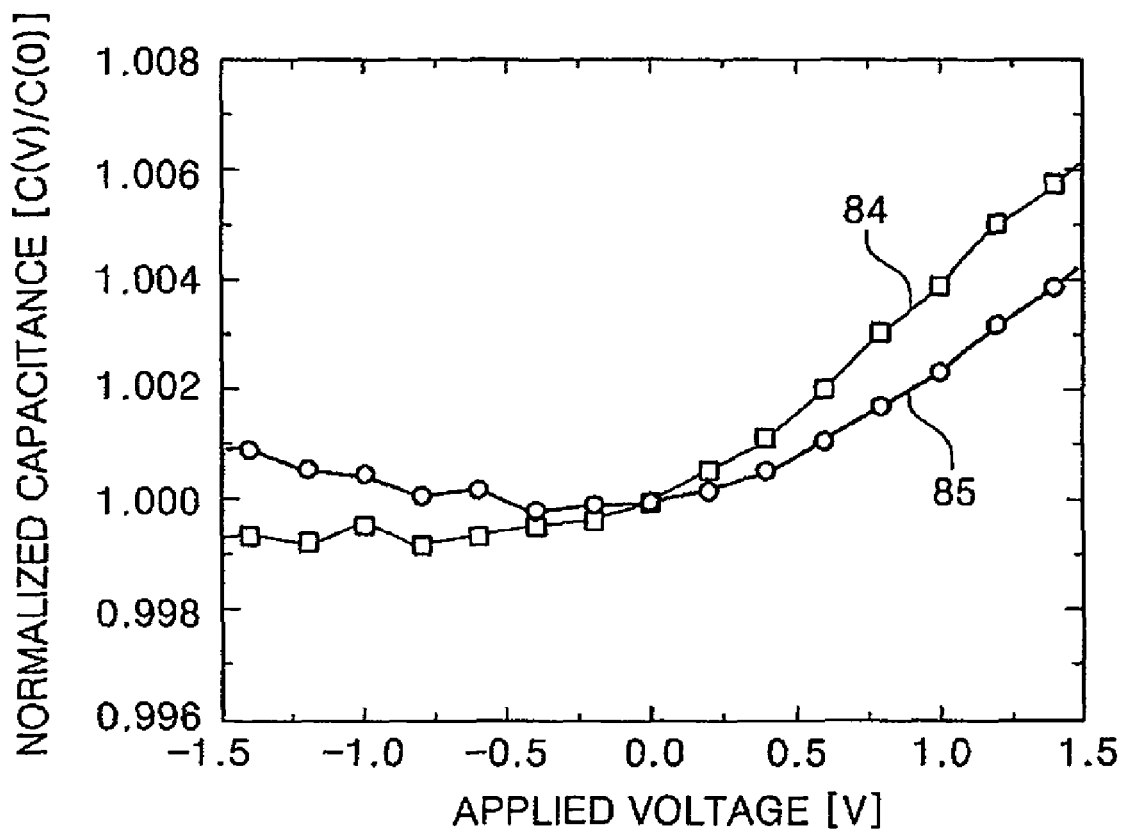
FIG. 10 is a capacitance-voltage plot of an analog capacitor fabricated according to another embodiment of the present invention.

FIG. 10 is a capacitance-voltage plot of an analog capacitor fabricated according to another embodiment of the present invention. The capacitance-voltage plot of FIG. 10 is a capacitance-voltage plot of an analog capacitor fabricated according to Table 2 below.

TABLE 2

| Sample | Lower electrode | Capacitor dielectric layer | Upper electrode |
|---|---|---|---|
| Fourth sample 84 | ALD-TiN | $Ta_2O_5/HfO_2/Ta_2O_5$ | Ru 50 Å/PVD-TiN |
| Fifth sample 85 | ALD-TiN | $Ta_2O_5/HfO_2/Ta_2O_5$ | Ru 50 Å/$O_2$ heat-treatment/ PVD-TiN |

For the fourth sample 84, an upper electrode was formed of a stacked layer of a Ru layer and a TiN layer by the PVD method. For the fifth sample 85, the Ru layer was heat-treated and oxidized at a temperature of about 400° C. for about thirty minutes in an $O_2$ atmosphere, and then a TiN layer was formed on the oxidized Ru layer by the PVD method. The surfaces of the lower electrodes of the fourth sample 84 and the fifth sample 85 are both oxidized while forming the capacitor dielectric layer.

The linear coefficient of the fourth sample 84 is $0.24 \times 10^{-2}$ while the linear coefficient of the fifth sample 85 is $0.13 \times 10^{-2}$.

As can be seen in FIG. 10, the capacitance-voltage plot of the fifth sample 85 is shifted right relative to the plot of the fourth sample 84. This result shows that forming the depletion layers on the upper and lower interfaces of the capacitor dielectric layer in balance by oxidizing the Ru layer adjacent to the capacitor dielectric layer may reduce a linear coefficient of the capacitance-voltage plot. Even though the Ru layer is oxidized, the Ru layer remains conductive, and the increase of the resistivity due to the oxidization is negligible. However, since deviation in capacitance in the analog capacitor is measured in parts per million (ppm), which is very small, the Ru layer will have an increased resistance value when oxidized, and thus will form depletion layers adjacent to the capacitor dielectric layer.

As described above, according to the present invention, it is possible to fabricate an analog capacitor having enhanced VCC properties by properly adjusting the resistance of upper/lower electrodes.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

The invention claimed is:

1. An analog capacitor, comprising:
a lower electrode including a lower conductive layer;
a capacitor dielectric layer on the lower conductive layer;
an upper electrode on the capacitor dielectric layer opposite to the lower electrode, the upper electrode including at least an upper conductive layer containing oxygen in contact with the capacitor dielectric layer, wherein the upper conductive layer has a resistivity higher than that of the lower conductive layer, and when a voltage is applied between the lower electrode and the upper electrode, a lower depletion region in the lower electrode has a same or a substantially same capacitance as an upper depletion region in the upper electrode; and
an oxygen-doped layer interposed between the lower conductive layer and the capacitor dielectric layer and having a resistivity higher than that of the lower conductive layer.

2. The analog capacitor as claimed in claim 1, wherein:
the lower depletion region is in the oxygen-doped layer in contact with the capacitor dielectric layer when the voltage is applied between the lower electrode and the upper electrode; and
the upper depletion region is in the upper conductive layer in contact with the capacitor dielectric layer when the voltage is applied between the lower electrode and the upper electrode.

3. The analog capacitor as claimed in claim 2, wherein the lower conductive layer is a ruthenium (Ru) layer, a platinum (Pt) layer, an iridium (Ir) layer, a titanium nitride (TiN) layer, a tantalum nitride (TaN) layer, a tungsten nitride (WN) layer, a metal nitride layer containing silicon (Si), or a metal nitride layer containing aluminum (Al).

4. The analog capacitor as claimed in claim 2, wherein the oxygen-doped layer is a metal layer containing oxygen or a metal nitride layer containing oxygen, the metal layer or the metal nitride layer being the same material as the lower conductive layer.

5. The analog capacitor as claimed in claim 2, wherein the oxygen-doped layer is an oxidized upper portion of the lower conductive layer.

6. The analog capacitor as claimed in claim 1, wherein the capacitor dielectric layer includes one of a silicon oxide ($SiO_2$) layer, a silicon nitride ($Si_3N_4$) layer, a metal oxide layer, a perovskite dielectric layer, or a stacked layer combination thereof.

7. The analog capacitor as claimed in claim 6, wherein:
the metal oxide layer includes one of aluminum oxide ($Al_2O_3$) layer, a hafnium oxide ($HfO_2$) layer, a lanthanum oxide ($La_2O_3$) layer, a zirconium oxide ($ZrO_2$) layer, or a tantalum oxide ($Ta_2O_5$) layer, and
the perovskite dielectric layer includes one of a barium strontium titanate (BST) layer, a lead zirconate titanate (PZT) layer, a strontium bismuth tantalite (SBT) layer or a strontium titanate (ST) layer.

8. The analog capacitor as claimed in claim 1, wherein the upper conductive layer is a metal layer containing oxygen or a metal nitride layer containing oxygen.

9. The analog capacitor as claimed in claim 8, wherein the metal layer is a ruthenium (Ru) layer, a platinum (Pt) layer or an iridium (Ir) layer, and the metal nitride layer is a titanium nitride (TiN) layer, a tantalum nitride (TaN) layer, a tungsten nitride (WN) layer, a metal nitride layer containing silicon (Si), or a metal nitride layer containing aluminum (Al).

10. The analog capacitor as claimed in claim 8, wherein the upper conductive layer is an oxide layer of titanium nitride (TiON) when the lower conductive layer is a titanium nitride (TiN) layer.

11. The analog capacitor as claimed in claim 8, wherein the upper conductive layer is an oxide layer of ruthenium ($RuO_2$) when the lower conductive layer is a ruthenium (Ru) layer.

12. The analog capacitor as claimed in claim 1, wherein the upper electrode further comprises an additional upper conductive layer on the upper conductive layer, the additional upper conductive layer having a resistivity lower than that of the upper conductive layer.

13. The analog capacitor as claimed in claim 1, wherein the capacitor dielectric layer has a positive quadratic coefficient of the capacitance-voltage plot.

14. The analog capacitor as claimed in claim 13, wherein:
the lower depletion region and the upper depletion region are respectively in the oxygen-doped layer and the upper conductive layer at portions adjacent to the capacitor dielectric layer when the voltage is applied between the lower electrode and the upper electrode, and the lower depletion region and the upper depletion region reduce the quadratic coefficient of the capacitance-voltage of the capacitor dielectric layer.

15. The analog capacitor as claimed in claim 1, wherein the capacitor dielectric layer includes one of a silicon oxide ($SiO_2$) layer, a silicon nitride ($Si_3N_4$) layer, a metal oxide layer, a perovskite dielectric layer, or a stacked layer combination thereof, and the capacitor dielectric layer includes at least one dielectric layer having a positive quadratic coefficient of the capacitance-voltage plot.

16. The analog capacitor as claimed in claim 15, wherein the at least one dielectric layer is an aluminum oxide ($Al_2O_3$) layer, the silicon nitride ($Si_3N_4$) layer, or a hafnium oxide ($HfO_2$) layer.

* * * * *